(12) United States Patent
Chen et al.

(10) Patent No.: US 11,150,129 B2
(45) Date of Patent: Oct. 19, 2021

(54) OPTICAL SENSING MODULE

(71) Applicant: EMINENT ELECTRONIC TECHNOLOGY CORP. LTD., Hsinchu (TW)

(72) Inventors: Yi-Yung Chen, New Taipei (TW); Kao-Pin Wu, New Taipei (TW); Tom Chang, Taipei (TW)

(73) Assignee: EMINENT ELECTRONIC TECHNOLOGY CORP. LTD., Hsinchu (TW)

( * ) Notice: Subject to any disclaimer, the term of this patent is extended or adjusted under 35 U.S.C. 154(b) by 163 days.

(21) Appl. No.: 16/405,764

(22) Filed: May 7, 2019

(65) Prior Publication Data

US 2019/0368923 A1     Dec. 5, 2019

Related U.S. Application Data

(60) Provisional application No. 62/677,194, filed on May 29, 2018.

(30) Foreign Application Priority Data

Oct. 5, 2018  (TW) .................................. 107135316

(51) Int. Cl.
  *G01J 1/02*     (2006.01)
  *G01J 1/42*     (2006.01)
  *G01J 1/44*     (2006.01)

(52) U.S. Cl.
  CPC ........... *G01J 1/0295* (2013.01); *G01J 1/0271* (2013.01); *G01J 1/4204* (2013.01); *G01J 1/4228* (2013.01); *G01J 1/44* (2013.01)

(58) Field of Classification Search
  CPC .......... G01J 1/0295; G01J 1/04; G01J 1/0407; G01J 1/06; G01J 1/0271; G01J 2001/063; G01J 1/4204; G01J 1/42; G01J 1/4228; G01J 1/44
  See application file for complete search history.

(56) References Cited

U.S. PATENT DOCUMENTS

| 6,995,836 | B1* | 2/2006 | Tondorf | G01D 5/26 356/138 |
|---|---|---|---|---|
| 2011/0133941 | A1* | 6/2011 | Yao | G01J 1/0271 340/600 |
| 2012/0091372 | A1* | 4/2012 | Molnar | H01L 27/14685 250/550 |
| 2012/0295665 | A1* | 11/2012 | Pantfoerder | G01J 1/0437 455/566 |

(Continued)

FOREIGN PATENT DOCUMENTS

| CN | 104220966 A | 12/2014 |
|---|---|---|
| CN | 106066495 A | 11/2016 |

(Continued)

*Primary Examiner* — John R Lee
(74) *Attorney, Agent, or Firm* — Muncy, Geissler, Olds & Lowe, P.C.

(57) ABSTRACT

An optical sensing module has a light source and an optical sensing integrated circuit device. The optical sensing integrated circuit device has an optical sensor and a grating. The optical sensor and the light source are arranged along a first direction. The grating is formed over the optical sensor and has multiple parallel wires. The multiple wires are perpendicular to the first direction.

13 Claims, 4 Drawing Sheets

(56) References Cited

U.S. PATENT DOCUMENTS

| | | | | |
|---|---|---|---|---|
| 2013/0048837 | A1* | 2/2013 | Pope | G01J 1/4204 |
| | | | | 250/214.1 |
| 2015/0144934 | A1* | 5/2015 | Rappoport | G02B 5/208 |
| | | | | 257/40 |
| 2015/0276976 | A1* | 10/2015 | Holenarsipur | G06F 1/169 |
| | | | | 250/338.1 |
| 2016/0084650 | A1* | 3/2016 | Hsu | G01S 3/7803 |
| | | | | 356/4.01 |
| 2016/0363779 | A1* | 12/2016 | Huang | G02F 1/1524 |
| 2017/0284864 | A1 | 10/2017 | Chen | |
| 2019/0368923 | A1* | 12/2019 | Chen | G01J 1/4204 |
| 2020/0096686 | A1* | 3/2020 | Cool | G06F 1/1637 |

FOREIGN PATENT DOCUMENTS

| | | |
|---|---|---|
| CN | 106127102 A | 11/2016 |
| CN | 106159026 A | 11/2016 |
| CN | 107293558 A | 10/2017 |
| EP | 3261134 A1 | 12/2017 |
| TW | 201635089 A | 10/2016 |
| TW | I558982 B | 11/2016 |
| WO | 2014/099728 A1 | 6/2014 |

\* cited by examiner

OPTICAL SENSING MODULE

CROSS-REFERENCE TO RELATED APPLICATIONS

This application claims the benefit of U.S. provisional application filed on May 29, 2018 and having application Ser. No. 62/677,194, the entire contents of which are hereby incorporated herein by reference.

This application is based upon and claims priority under 35 U.S.C. 119 from Taiwan Patent Application No. 107135316 filed on Oct. 5, 2018, which is hereby specifically incorporated herein by this reference thereto.

BACKGROUND OF THE INVENTION

1. Field of the Invention

The present invention relates to an optical sensing module, specifically related to an optical sensing module having grating.

2. Description of the Prior Arts

A proximity sensor and an ambient light sensor are generally used in a portable electronic device, such as smartphones. In general, the proximity sensor is around the ambient light sensor. To increase signal-to-noise ratio (SNR) of the proximity sensor, in the prior art a geometric structure (opening) is used to narrow a field of view of the proximity sensor. For example, the opening above the proximity sensor for light to enter is narrowed to decrease noise entering the proximity sensor. However, the prior art has following drawbacks. One is that the geometric structure also narrows a field of view of the ambient light sensor to affect an operation thereof. Another is that an allowable tolerance range is reduced when a size of the component is reduced, which results in difficulty in producing a desired geometric structure.

Therefore, a new optical sensing module is required to increase the SNR of the optical sensing module effectively without limitation of the geometric structure.

To overcome the shortcomings, the present invention provides an optical sensing module to mitigate or obviate the aforementioned problems.

SUMMARY OF THE INVENTION

An objective of the present invention provides an optical sensing module with a grating to overcome the drawbacks of the conventional optical sensing module.

The optical sensing module of the present invention has:
a light source; and
an optical sensing integrated circuit device comprising:
a first optical sensor, wherein the first optical sensor and the light source are arranged along a first direction; and
a grating formed over the first optical sensor and has multiple parallel wires, the multiple wires are perpendicular to the first direction.

Since the grating is formed above the first optical sensor, noises entering the first optical sensor are reduced and an SNR of the optical sensing module is increased.

Other objectives, advantages and novel features of the invention will become more apparent from the following detailed description when taken in conjunction with the accompanying drawings.

DETAILED DESCRIPTION OF THE EMBODIMENTS

Figure 1:
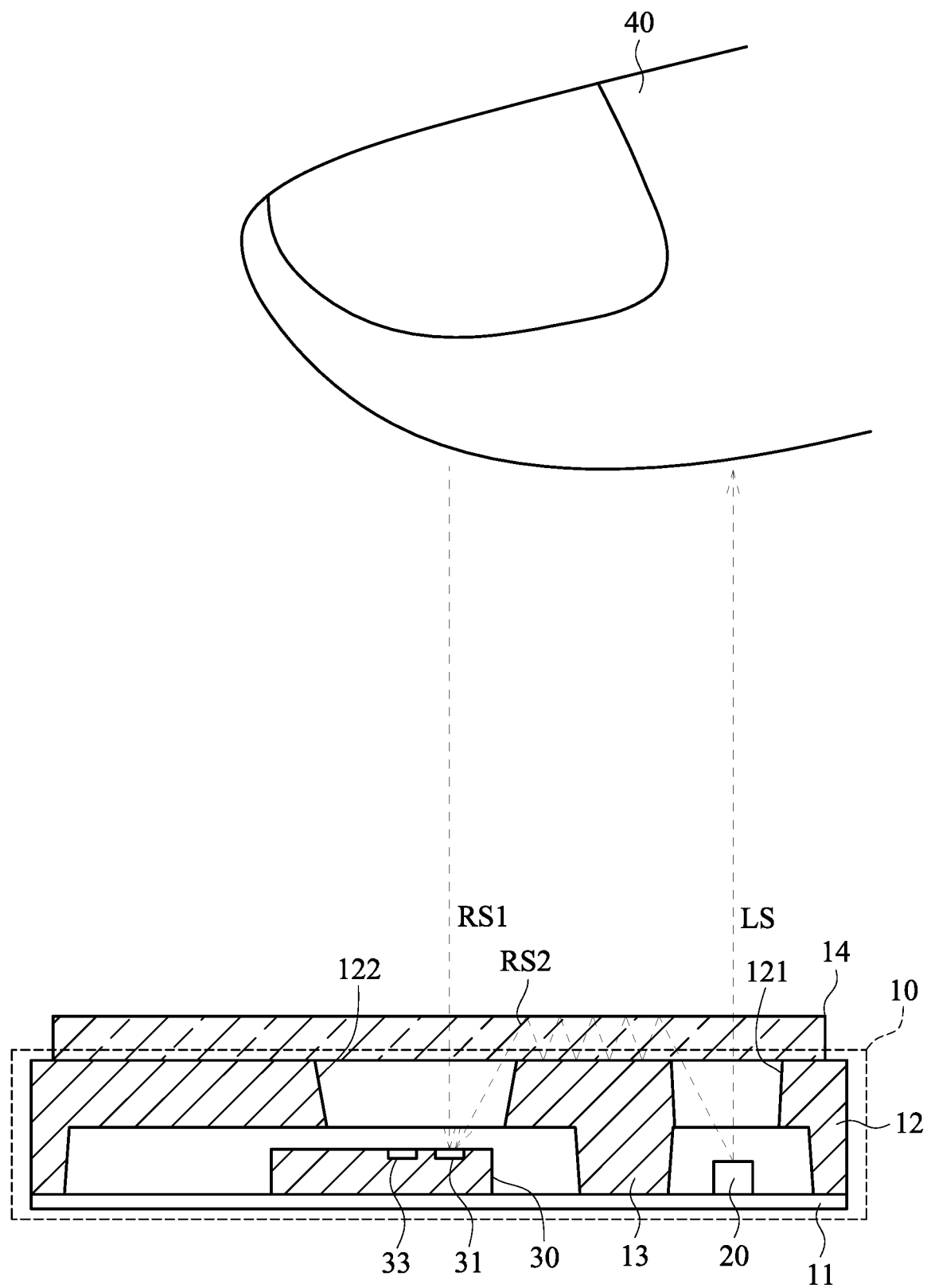
FIG. 1 is a cross-sectional view of one embodiment of an optical sensing module in accordance with the present invention.
Figure 2:
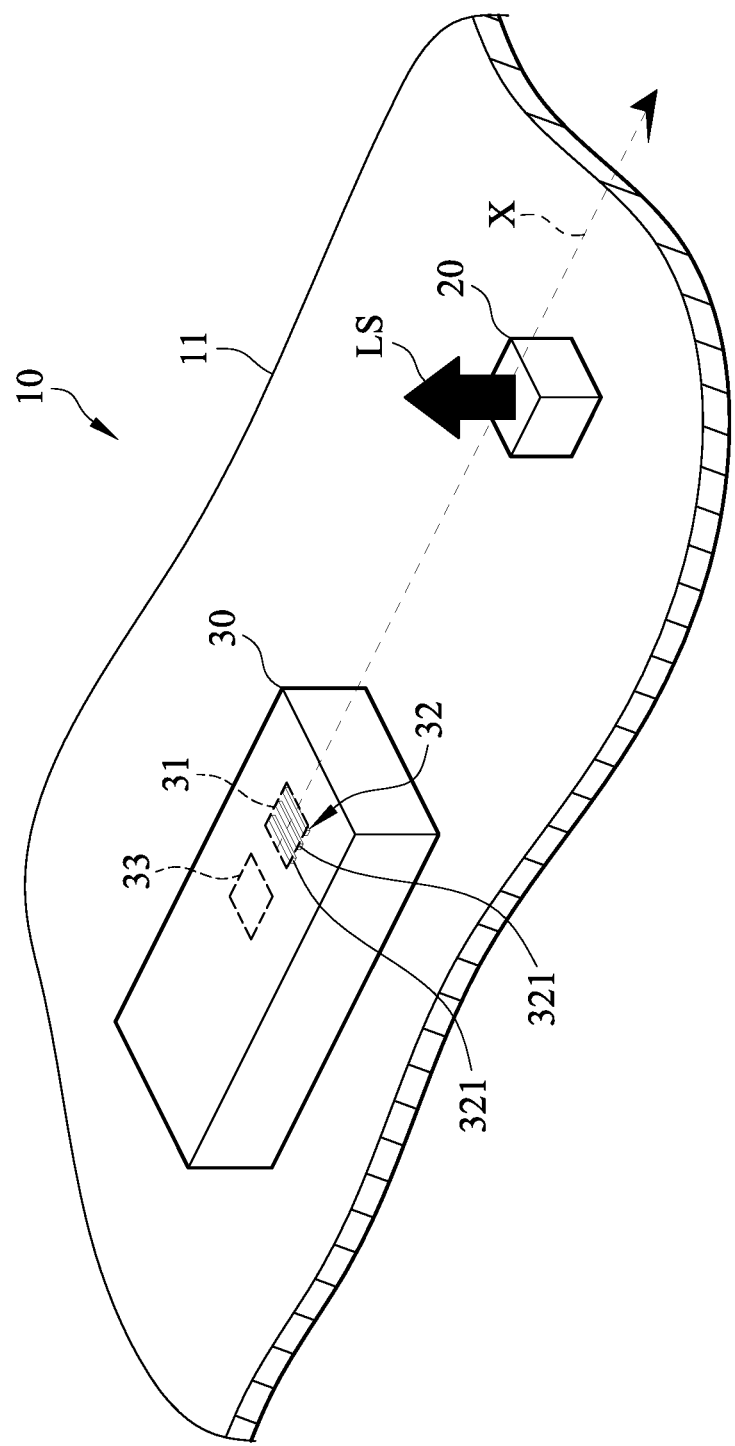
FIG. 2 is a schematic view of a light source and a first optical sensor in FIG. 1.

FIG. 2 provides a schematic view of an optical sensing module 10 of the present invention. The optical sensing module 10 may be a part of an electronic device (not shown in FIG. 1). The electronic device may be, but not limited to, a portable electronic device, such as mobile phone, tablet computer or laptop computer.

The light sensing module 10 may comprise (but not limited to) a light source 20 and an optical sensing integrated circuit device 30. The light source 20 and the optical sensing integrated circuit device 30 are mounted on a circuit board 11. The light source 20 may be an infrared light emitting diode to emit infrared light. The optical sensing integrated circuit device 30 comprises a first optical sensor 31 and a second optical sensor 33. In one embodiment, the first optical sensor 31 is a proximity sensor (PS) for sensing proximity of an object and the second optical proximity sensor 33 is an ambient light sensor (ALS) for detecting ambient lights. The proximity sensor may be (but not limited to) an infrared sensor.

FIG. 2 shows position relationship between the first optical sensor 31 and the light source 20. The first optical sensor 31 and the light source 20 are arranged along a first direction X. A grating is formed over the first optical sensor 31. The grating has multiple parallel wires 321. The wires 321 are perpendicular to the first direction X.

Figure 3A:
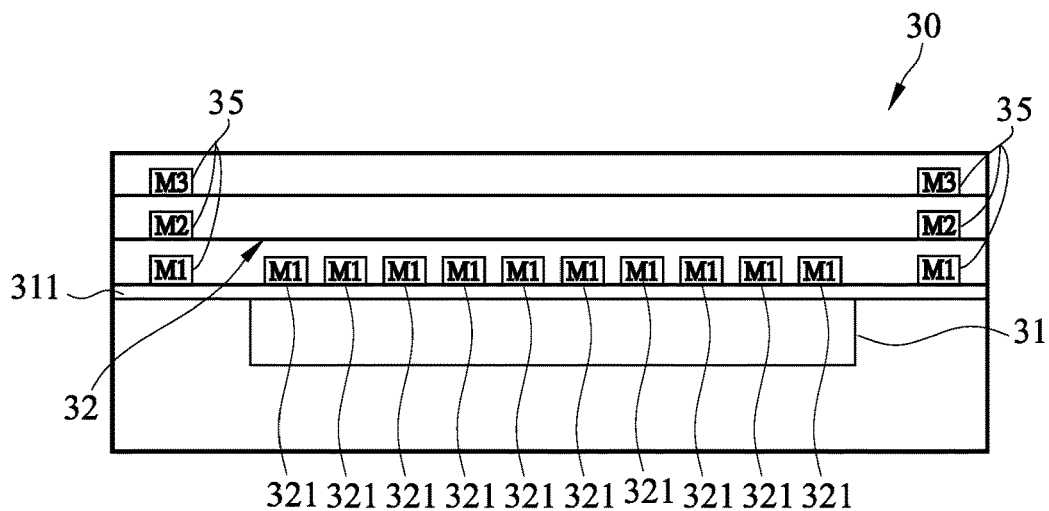
FIG. 3A is a side view of a partial cross section of a first embodiment of a first optical sensor of the optical sensing module in accordance with the present invention.
Figure 3B:
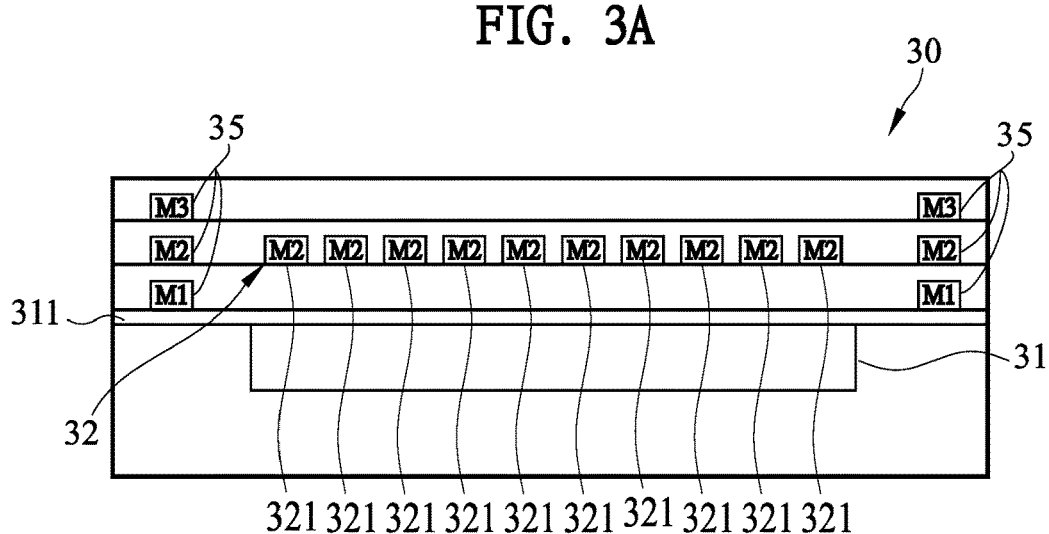
FIG. 3B is a side view of a partial cross section of a second embodiment of a first optical sensor of the optical sensing module in accordance with the present invention.
Figure 3C:
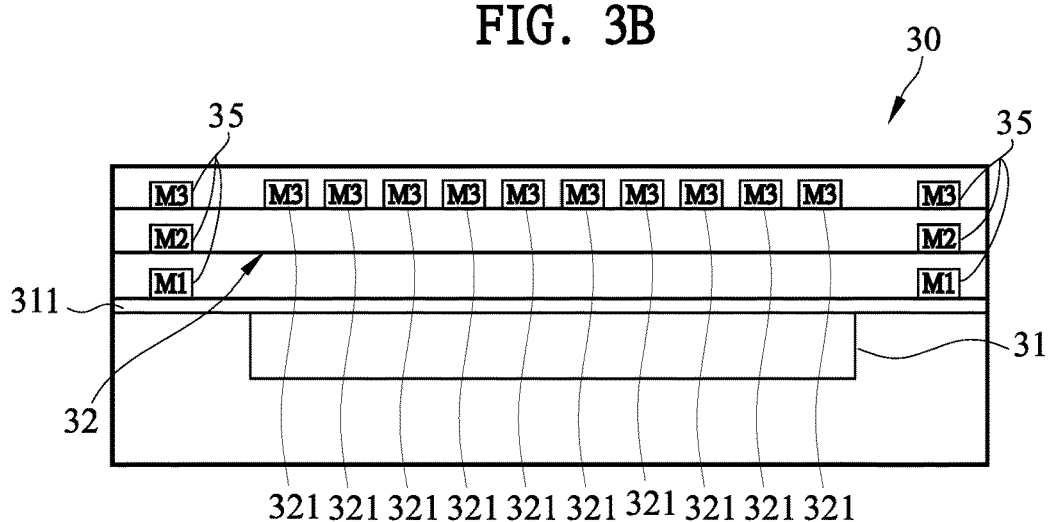
FIG. 3C is a side view of a partial cross section of a third embodiment of a first optical sensor of the optical sensing module in accordance with the present invention.

FIGS. 3A to 3C are side views, in partial cross section, of different embodiments of the optical sensing integrated circuit device 30, taken along the X direction shown in FIG. 2. Multiple conductive layers M1, M2 and M3 are sequentially formed over the first optical sensor 31. In one embodiment, the conductive layers M1, M2 and M3 are made of metal material. A transparent dielectric layer is formed between the first optical sensor and the conductive layer M1 and allows the lights to pass through. The grating consisted of the parallel wires 321 may be formed by one of the conductive layers M1, M2 and M3. The wires of the grating can be formed in the process for fabricating the conductive layer. For example, in the first embodiment of FIG. 3A, the wires 321 of the grating 32 are formed by the conductive layer M1. In the second embodiment of FIG. 3B, the wires 321 of the grating 32 are formed by the conductive layer M2. In the third embodiment of FIG. 3C, the wires 321 of the grating 32 are formed by the conductive layer M3. The conductive layers M1, M2 and M3 further comprise multiple traces 35. The traces 35 are used to transmit electronic signals or sensing signals of the first optical sensor 31. In another embodiment, more or less conductive layers may be formed above the first optical sensor in accordance with present invention.

Figure 5:
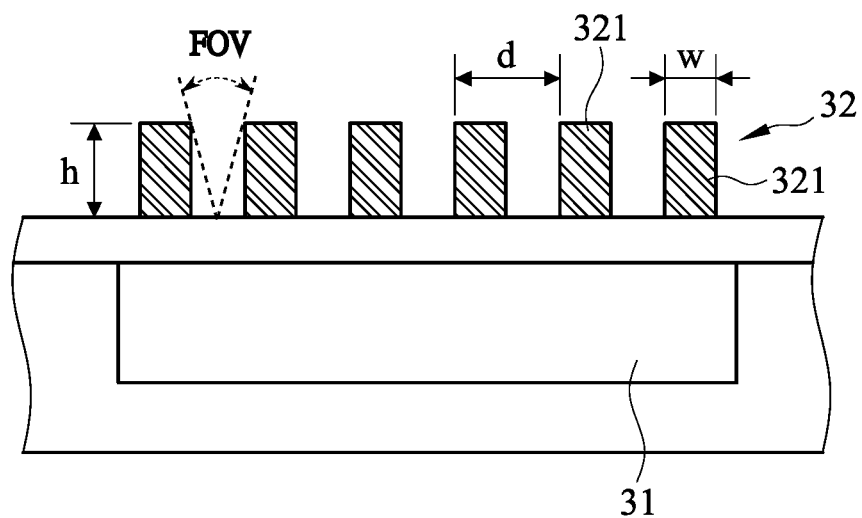
FIG. 5 is an enlarged and cross-sectional view of FIG. 3 in partial.

With further reference to FIG. 5, field of view (FOV) of the first optical sensor 31 is determined based on a width "w" and a height "h" and of the wire 321 of the grating 32 and a distance "d" between the wire 321 of the grating 32. The field of view may be understood as a range of incidence angle for allow light to enter the first optical sensor 31. The smaller the field of view is, the less light enters the first optical sensor 31. Therefore, the width "w" and the height "h" and of the wire 321 of the grating 32 and the distance "d" between the wire 321 of the grating 32 are determined by desired signal-to-noise ratio of the first optical sensor 31. In the embodiment of FIG. 1, the optical sensing module 10 further comprise (but not limited to) a housing 12 and a wall 13. The housing 12 is mounted on the circuit board 11 and covers the light source 20 and the optical sensing integrated circuit device 30. A first opening 121 is formed through the housing 12 and aligns with the light source 20 to allow the light from the light source 20 to pass through. A second opening 122 is formed through the housing 12 and aligns with the first optical sensor 31 and the second optical sensor 33 to allow the light to enter the first optical sensor 31 and the second optical sensor 33. The wall 13 is formed between the light source 20 and the optical sensing integrated circuit device 30 to separate the light source 20 from the optical sensing integrated circuit device 30. In the embodiment of FIG. 1, the wall 13 is downwardly extended from an inner top of the housing 12 until against the circuit board 11.

A glass 14 on the housing 12 is a part of the electronic device. A part of the light signal LS upwardly emitted from the light source 20 passes through the glass 14 and reflected by an object 40 (such as a finger) outside of the electronic device to generate a first reflected light RS1 directed to the first optical sensor 31. Another part of the light signal LS upwardly emitted from the light source 20 is reflected inside the glass 14 for many times to generate a second reflected light RS2 directed to the first optical sensor 31. For the first optical sensor 31, the first reflected light RS1 is for sensing proximity of the object but the second reflected light is unwanted noise.

Figure 4:
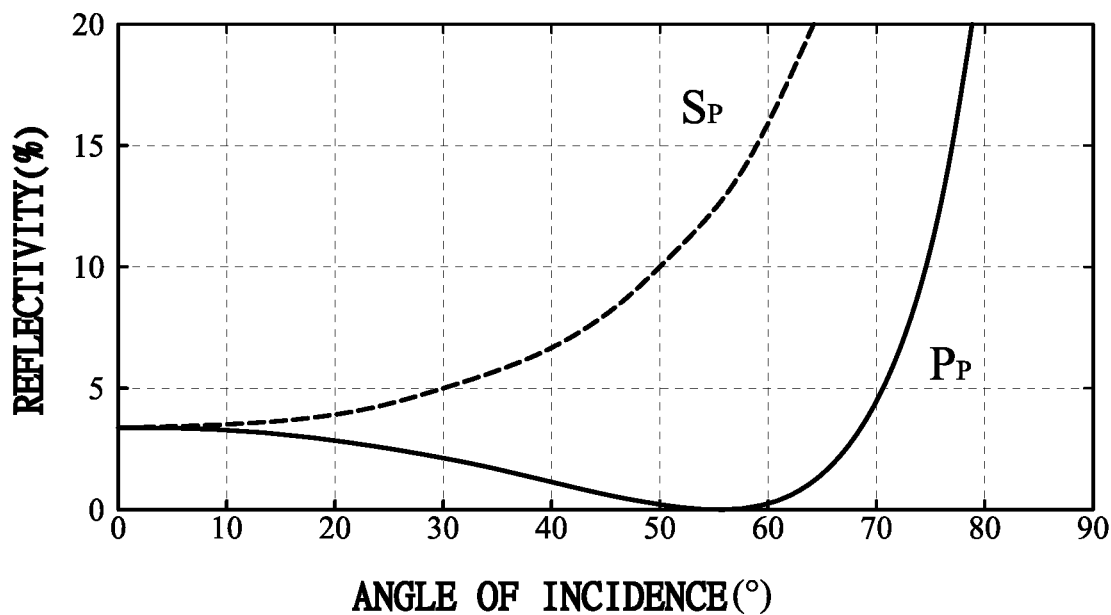
FIG. 4 is a characteristic graph of a relationship between angle of incidence and reflectivity when lights enter a glass.

With further reference to FIG. 4, a characteristic graph of a relationship between an incidence angle and refractive index for light entering a glass is shown. From the FIG. 4, it can be understood that the second reflected light RS2 comprise more S-polarization light $S_p$ than P-polarization light $P_p$. If the S-polarization light of the second reflected light RS2 entering the first optical sensor 31 is decreased, the signal-to-noise ratio of the first optical sensor 31 can be improved.

The grating 32 formed above the first optical sensor 31 functions as a polarizer. The grating 32 can reflects the S-polarization light $S_p$ in the second reflected light RS2 to greatly decrease energy of the S-polarization light $S_p$, thus the noise is decreased and the signal-to-noise ratio of the first optical sensor 31 is improved.

On the other hand, from the field of view (FOV) shown in FIG. 5, it can be understood that the grating 32 narrows the range of incidence angle for the light entering the first optical sensor 31. Since the incidence angle of the second reflected light RS2 (regarded as noise) directing to the first optical sensor 31 is greater, most of the second reflected light RS2 can not enter the first optical sensor 31. Since the incidence angle of the first reflected light RS1 directing to the first optical sensor 31 is very small, the first reflected light RS1 can pass through the grating 32 and received by the first optical sensor 31. In other words, the physical structure of the grating 32 can narrow the field of view of the first optical sensor 31 to decrease the noise (the second reflected light RS2) entering the first optical sensor 31, thus the signal-to-noise ratio is increased. Furthermore, since the grating 32 is able to narrow the field of view of the first optical sensor 31, the grating 32 can replaced an opening in the prior art used to narrow the field of view of the first optical sensor 31. Therefore, the precision requirement of the second opening 122 of the housing 12 is decreased, which is beneficial to develop small-sized optical sensing module 10.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An optical sensing module, comprising:
  a light source;
  an optical sensing integrated circuit device comprising:
    a first optical sensor, wherein the first optical sensor and the light source are arranged along a first direction; and
    a grating formed over the first optical sensor and having multiple parallel wires, wherein the multiple wires are perpendicular to the first direction, wherein the grating functions as a polarizer;
  a circuit board for mounting the light source and the optical sensing integrated circuit device; and
  a housing mounted on the circuit board to cover the light source and the optical sensing integrated circuit device, wherein the housing comprises:
    a first opening aligning with the light source; and
    a second opening aligning with the first optical sensor of the optical sensing integrated circuit device.

2. The optical sensing module as claimed in claim 1, wherein the optical sensing integrated circuit device comprises multiple conductive layers over the first optical sensor, and the multiple wires are formed by one of the conductive layers.

3. The optical sensing module as claimed in claim 1, wherein the first optical sensor is a proximity sensor to sense proximity of an object.

4. The optical sensing module as claimed in claim 2, wherein the first optical sensor is a proximity sensor to sense proximity of an object.

5. The optical sensing module as claimed in claim 1, wherein the first optical sensor is an infrared sensor.

6. The optical sensing module as claimed in claim 2, wherein the first optical sensor is an infrared sensor.

7. The optical sensing module as claimed in claim 1, wherein the optical sensing integrated circuit device further comprises a second optical sensor and the second optical sensor is an ambient light sensor to sense ambient light.

8. The optical sensing module as claimed in claim 2, wherein the optical sensing integrated circuit device further comprises a second optical sensor and the second optical sensor is an ambient light sensor to sense ambient light.

9. The optical sensing module as claimed in claim 1, wherein the light source is an infrared light emitting diode.

10. The optical sensing module as claimed in claim 2, wherein the light source is an infrared light emitting diode.

11. The optical sensing module as claimed in claim 1, wherein the housing further comprises a wall and the wall is formed between the light source and the optical sensing integrated circuit device.

12. The optical sensing module as claimed in claim 2, wherein the housing further comprises a wall and the wall is formed between the light source and the optical sensing integrated circuit device.

13. The optical sensing module as claimed in claim 1, wherein the grating decreases noise entering the first optical sensor.

* * * * *